United States Patent [19]

Jay

[11] Patent Number: 4,482,907
[45] Date of Patent: Nov. 13, 1984

[54] PLANAR-TYPE FIELD-EFFECT TRANSISTOR HAVING METALLIZED-WELL ELECTRODES AND A METHOD OF FABRICATION OF SAID TRANSISTOR

[75] Inventor: Paul R. Jay, Paris, France

[73] Assignee: Thomson-CSF, Paris, France

[21] Appl. No.: 354,917

[22] Filed: Mar. 8, 1982

[30] Foreign Application Priority Data

Mar. 10, 1981 [FR] France ................................ 81 04719

[51] Int. Cl.³ .................... H01L 29/48; H01L 29/80; H01L 29/06
[52] U.S. Cl. ........................................ 357/22; 357/15; 357/55
[58] Field of Search .............................. 357/22, 15, 55

[56] References Cited

U.S. PATENT DOCUMENTS

| | | | |
|---|---|---|---|
| 2,790,037 | 4/1957 | Shockley | 357/22 |
| 2,869,054 | 1/1959 | Tucker | 357/22 |
| 3,767,984 | 10/1973 | Shinoda et al. | 357/15 |
| 3,836,993 | 9/1974 | Joshi | 357/22 |
| 4,297,718 | 10/1981 | Nishizawa et al. | 357/22 |
| 4,300,151 | 11/1981 | Nishizawa | 357/22 |
| 4,327,475 | 5/1982 | Asai et al. | 357/22 |
| 4,338,616 | 7/1982 | Bol | 357/22 |

FOREIGN PATENT DOCUMENTS

| | | | |
|---|---|---|---|
| 52-73681 | 6/1977 | Japan | 357/22 G |
| 55-141760 | 11/1980 | Japan | 357/22 G |
| 56-6471 | 1/1981 | Japan | 357/22 G |
| 2065967 | 7/1981 | United Kingdom | 357/22 GR |

Primary Examiner—Andrew J. James
Assistant Examiner—John Lamont
Attorney, Agent, or Firm—Oblon, Fisher, Spivak, McClelland & Maier

[57] ABSTRACT

A field-effect transistor having a gate consisting of a metallic plane projecting metallized wells of less than one micron in diameter through the channel layer downwards to the semiconductor substrate. They are formed by ion-beam etching. Metallization is performed by cathodic sputtering of a substance which forms a Schottky contact with the semiconductor. The wells are spaced at intervals of less than one micron so as to form a row and are joined together by means of a gate electrode.

6 Claims, 4 Drawing Figures

PLANAR-TYPE FIELD-EFFECT TRANSISTOR HAVING METALLIZED-WELL ELECTRODES AND A METHOD OF FABRICATION OF SAID TRANSISTOR

This invention relates to a planar field-effect transistor provided with electrodes of the "metallized well" type, and further relates to a method of fabrication of said transistor.

Considered from the double standpoint of geometry and operation, a field-effect transistor fabricated with the planar technology may be said to have a "lateral" structure. In fact the source, gate and drain electrodes are either formed or deposited, depending on whether it is required to form an ohmic contact or a Schottky contact on one face of a semiconductor solid. Together with this array of electrodes, the active layer is formed by preliminary epitaxial deposition on a semiconductor substrate or by ion implantation of doping impurities into the surface layer of said substate. During operation of the transistor, current is capable of flowing between source and drain only within the surface layer and is controlled by vertical action of the gate potential.

This structure and mode of operation are attended by a number of disadvantages which include the following:

deficient control of resistivity at the interface with the semi-insulating substrate, especially for the fabrication of integrated circuits of gallium arsenide;

the existence of traps at the "substrate-active layer" interface;

surface states which produce parasitic effects on the free-surface area, which is detrimental to good operation at low potential;

excessive ohmic resistance of the gate electrode as a result of the dimensions of this latter, even in an interdigitated structure;

ohmic resistance impairing the access to the semiconductor, especially on gallium arsenide;

excessive surface area which limits the integration density.

Vertical-type structures comprising buried electrodes have already been proposed. The method of fabrication of such structures is difficult to apply in practice, however, since buried electrodes are difficult to construct. This technology calls for the formation of heavily doped semiconducting regions but this is practically incompatible with the presence of a semiinsulating substrate which is necessary in gallium arsenide integrated circuits.

The invention proposes a remedy for the majority of these disadvantages.

The planar field-effect transistor according to the invention comprises a semiconductor substrate which comprises a region having high electrical resistivity. An active semiconductor layer has been deposited on said substrate in the high-resistivity region. Source, gate and drain electrodes deposited on the active layer establish with this latter an ohmic contact, a Schottky contact and an ohmic contact respectively.

The field-effect transistor is distinguished by the fact that the gate electrode is extended downwards within the semiconductor solid by a series of metallized wells which penetrate into the high-resistivity region of the semiconductor substrate and form a row located in a plane normal to the direction of the drain-source current.

The method of fabrication of the transistor according to the invention involves at least the following steps:

(a) delimitation of a row of small surfaces of the active layer by means of a first mask of material which is resistant to ionic etching (aluminum, for example);

(b) formation of wells by ionic etching (for example with argon ions) through the holes of the mask formed in step (a);

(c) metallization of the interior of the wells by cathodic sputtering of a metal which is capable of forming a Schottky contact with the semiconductor solid;

(d) replacement of the first mask by a second mask for delimiting a surface which extends over the entire row of metallized wells;

(e) deposition of a metal which is capable of forming a Schottky contact with the semiconductor material on the surface delimited in step (d) in order to constitute the gate electrode.

Other features of the invention will be more apparent to those skilled in the art upon consideration of the following description and accompanying drawings, wherein.

Figure 1:
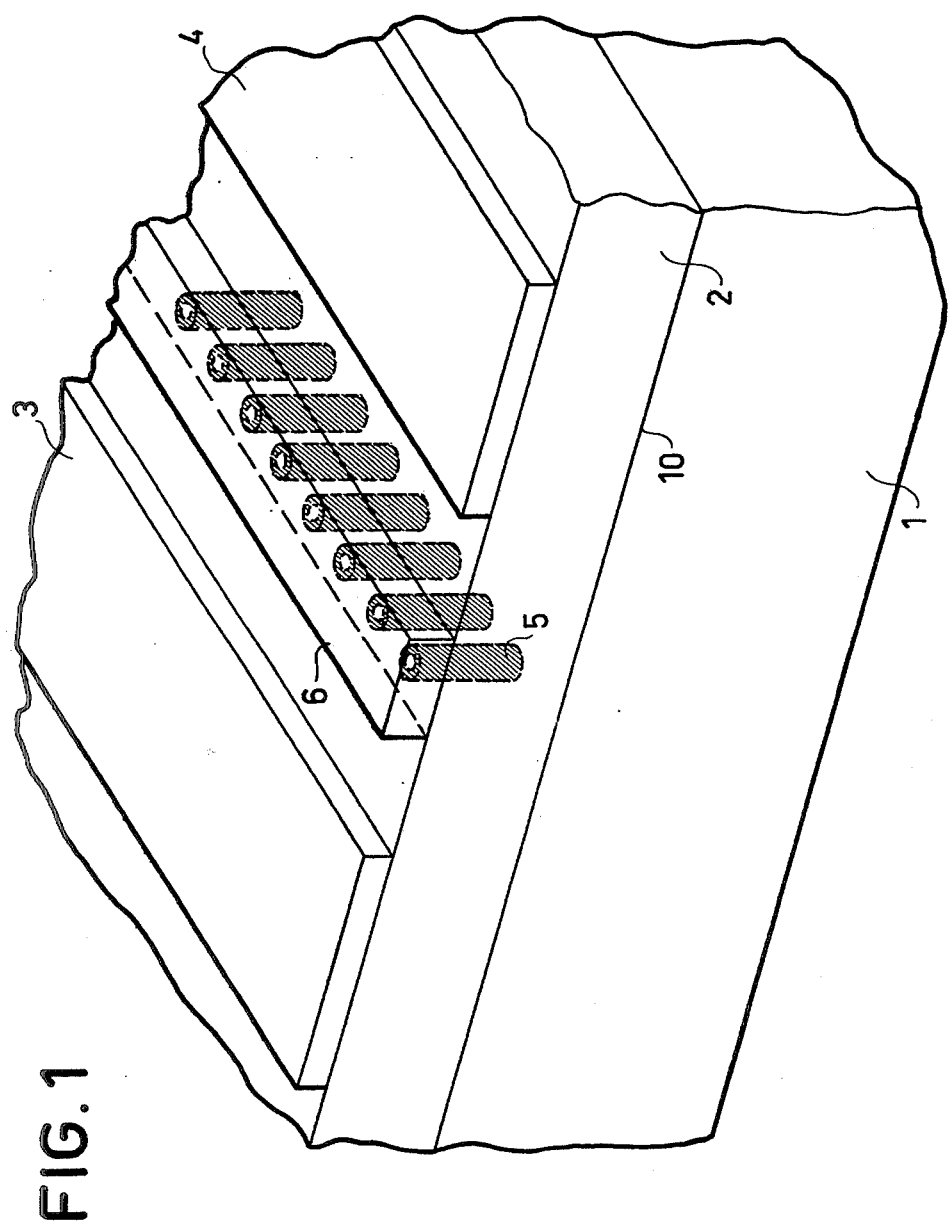
FIGS. 1 and 2 illustrate a first exemplified embodiment of the invention, respectively in fragmentary perspective and in longitudinal cross-section.

A fragment of transistor according to the invention as illustrated in perspective in FIG. 1 is constructed from a semiconductor solid shown in transverse cross-section.

The boundary 10 between the semiconductor substrate 1 of monocrystalline gallium arsenide, for example, and an active layer 2 is represented in the figure by a full line. Said active layer was formed, for example, by epitaxial growth on a substrate 1 of monocrystalline gallium arsenide which was lightly doped so as to have a very high resistivity. By way of example, the active layer 2 is of n-type conductivity and has a dopant concentration of the order of $8 \times 10^{16}$ at.cm$^{-3}$.

Two electrodes 3 and 4 are formed on the free surface of the layer 2 by successive depositions of nickel, germanium and gold in order to constitute ohmic contacts which are intended to serve as source and drain. A row of metallized wells 5 has been formed by the method mentioned in the foregoing. Said row is parallel to the longest dimension of the electrodes 3 and 4 and placed between these latter. The metallization is formed by successive depositions for example of titanium, platinum and gold. By way of example, the dimensions are as follows: a diameter of 0.5 to 1 micron in the case of each well, said wells being spaced at a distance of 0.5 to 0.8 micron.

The row is then covered with a deposit 6 of substantial length and formed of the same metals as those employed for the metallization of the wells 5. This deposit in fact constitutes the gate electrode 6 of the transistor.

Figure 2:
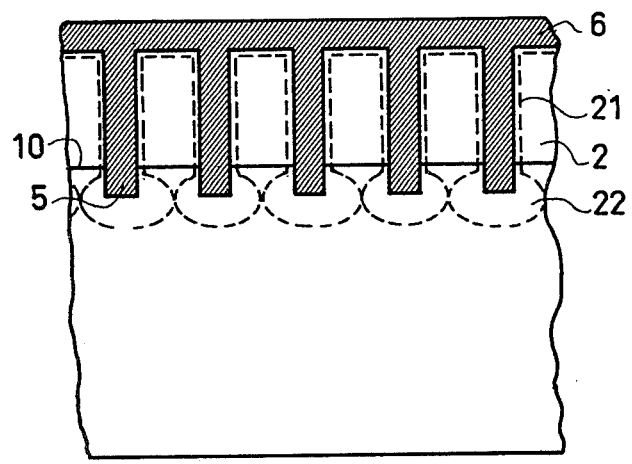

FIG. 2 is a view in cross-section along a plane located at right angles to the layer 2 and constituting a longitudinal plane of symmetry for the row of wells 5. The dashed line represents the limit of the free region located around the electrode 6 in respect of a given potential. This limit is located at a very short distance from the Schottky contact (at 21) in that portion of the gate which extends into the lightly doped layer 2 at a much greater distance (at 22) from the gate within the substrate which is even more lightly doped than the layer 2. The result thereby achieved is that, in respect of this potential, the charge-carrier conducting region is limited during operation of the transistor to the space located between the wells which constitute the teeth of a kind of vertical comb. On the contrary, the free regions surrounding the ends of the teeth of said comb form tubular regions 22 which repel the charge carriers and enhance the semi-insulating character of the substrate.

The resistance per millimeter of gate width is consequently also divided by a not-negligible factor.

Figure 3:
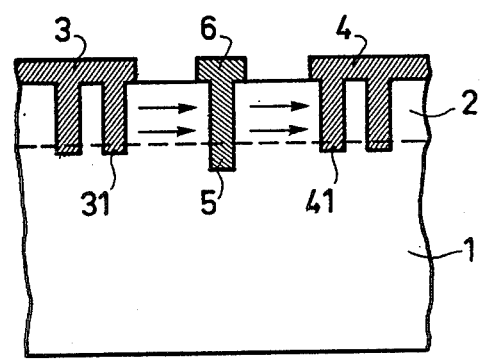
FIGS. 3 and 4 are sectional views showing other embodiments of the invention.

In FIG. 3, there is shown in transverse cross-section (and not in longitudinal cross-section as in FIG. 2) an embodiment of the invention in which the technology of fabrication of vertical combs with metallized wells is applied to the electrodes 3 and 4.

In this case, however, three important differences are observed:

(1) metallization of the wells 31 and 41 has been performed by making use of suitable materials for forming a good ohmic contact (such as nickel and the like);

(2) the wells 31 and 41 penetrate only to a slight extent or not at all into the region of the substrate 1.

(3) two or more rows of wells can be formed in respect of each electrode which extends over all the source or drain wells.

In this embodiment, the ohmic resistance and the active-layer access resistance are divided by a not-negligible factor, which has a contributory effect in improving the operation of the transistor to an even greater extent.

Figure 4:
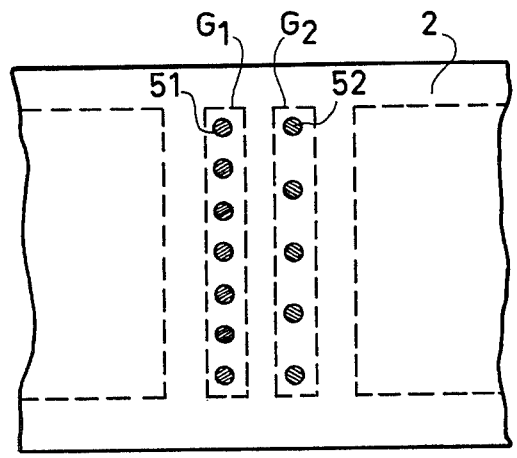

FIG. 4 provides a view of the transistor in cross-section along a plane parallel to the layer 2 and within the thickness of this latter. In this alternative embodiment, two rows of wells 51 and 52 have been formed, each row being covered by a separate gate $G_1$ or $G_2$. There are shown by way of example two vertical combs having different pitches, the wells 51 being spaced at closer intervals than the wells 52.

It is also possible to form two gates $G_1$ and $G_2$ which have the same pitch but in which the rows are relatively displaced in the longitudinal direction.

Field-effect transistors of this type having two gates biased at different potentials make it possible to control the current delivered by the transistor in different ways and also to operate the transistor as a phase-shifting device. In the case just mentioned, inasmuch as the charge carriers are successively deviated by the teeth of the two vertical combs, the transit paths of said carriers are variable as a function of the potentials applied to the gates $G_1$ and $G_2$.

In regard to the method of fabrication of the metallized wells in the case of the alternative embodiment of FIG. 3, this method must be completed as follows:

(1) in step (c), the wells which are intended for the source and drain electrodes are masked during metallization by means of an electronic masking product;

(2) in a supplementary step included between steps (c) and (d), provision is made for an operation which is similar to that of step (c) in which the wells intended for the gate electrode are masked during metallization by means of an electronic masking product;

(3) in step (d), the second mask delimits solely the surface of the future gate electrode;

(4) after step (e), operations similar to those of steps (d) and (e) are performed in order to form the source and drain electrodes at the location of the corresponding wells.

What is claimed is:

1. A planar field-effect transistor comprising:
   a semiconductor substrate;
   an active semiconductor layer arranged on said substrate;
   a source electrode located on said active layer;
   a drain electrode located on said active layer;
   at least one gate electrode having a first portion arranged on said active layer and a second portion formed as a plurality of metallized wells arranged in a row in a plane normal to the direction of the drainsource current, each of said wells extending downwardly from said first portion through said active layer and into said substrate.

2. A transistor according to claim 1, wherein said source electrode and said drain electrode each extend downwardly into said active layer.

3. A transistor according to claims 1 or 2 wherein said transistor comprises at least two gate electrodes.

4. A transistor according to claim 3 wherein the interval between wells is different for each of said at least two gate electrodes.

5. A transistor according to claim 3 wherein each of said gate electrodes is offset from the others in the direction of said row.

6. A transistor according to claim 1 wherein a free region is formed in said active layer and said substrate around each of said gate electrodes when a potential is applied thereto, the regions in the substate touching each other to form a single continuous region while the regions in the active layer do not touch, so that the charge-carrier conduction region is limited to the space between the wells in the active layer.

* * * * *